US006404248B1

United States Patent
Yoneda

(10) Patent No.: US 6,404,248 B1
(45) Date of Patent: Jun. 11, 2002

(54) DELAY LOCKED LOOP CIRCUIT FOR SYNCHRONIZING INTERNAL SUPPLY CLOCK WITH REFERENCE CLOCK

(75) Inventor: Satoshi Yoneda, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/962,546

(22) Filed: Sep. 24, 2001

(30) Foreign Application Priority Data

Sep. 26, 2000 (JP) .................................... 2000-291737

(51) Int. Cl.⁷ ................................................. H03L 7/06
(52) U.S. Cl. ...................... 327/158; 327/163; 327/236
(58) Field of Search ................................. 327/156, 158, 327/159, 161, 163, 263, 276, 277, 231, 233, 234, 236, 31, 35; 375/374, 376

(56) References Cited

U.S. PATENT DOCUMENTS 5,550,878 A * 8/1996 Shigaki et al. ............... 375/376
5,604,775 A * 2/1997 Saitoh et al. ................. 375/376
5,994,934 A * 11/1999 Yoshimura et al. ......... 327/158

FOREIGN PATENT DOCUMENTS

| JP | 01-213028 | 8/1989 |
| JP | 09-083354 | 3/1997 |
| JP | 10-270998 | 10/1998 |
| JP | 11-017529 | 1/1999 |
| JP | 11-205102 | 7/1999 |
| JP | 2000-188533 | 7/2000 |

* cited by examiner

Primary Examiner—Toan Tran
Assistant Examiner—An T. Luu

(57) ABSTRACT

A DLL circuit has edge detecting/phase comparing portion 2 that generates an original comparison signal that is set to logic "1" when the rise-up of feedback clock FBCLK is prior to the rise-up of reference clock RCLK, and also set to logic "0" when: the rise-up of the feedback clock FBCLK is subsequent to the rise-up of the reference clock RCLK, outputs the original comparison signal as subsequent phase comparison result CMPR when it is detected that the level of the reference clock RCLK and the level of the feedback clock FBCLK are varied in same directions within time T0, and keeps the output logical level of the phase comparison result CMPR and outputs it as subsequent phase comparison result CMPR when it is detected that the level of the reference clock RCLK and the feedback clock FBCLK are varied in opposite directions within the time T0.

9 Claims, 11 Drawing Sheets

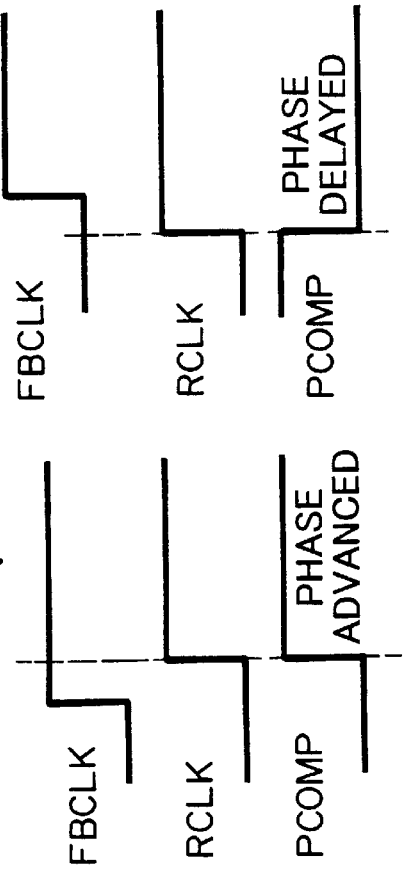
FIG.2A (PRIOR ART)
FIG.2B (PRIOR ART)
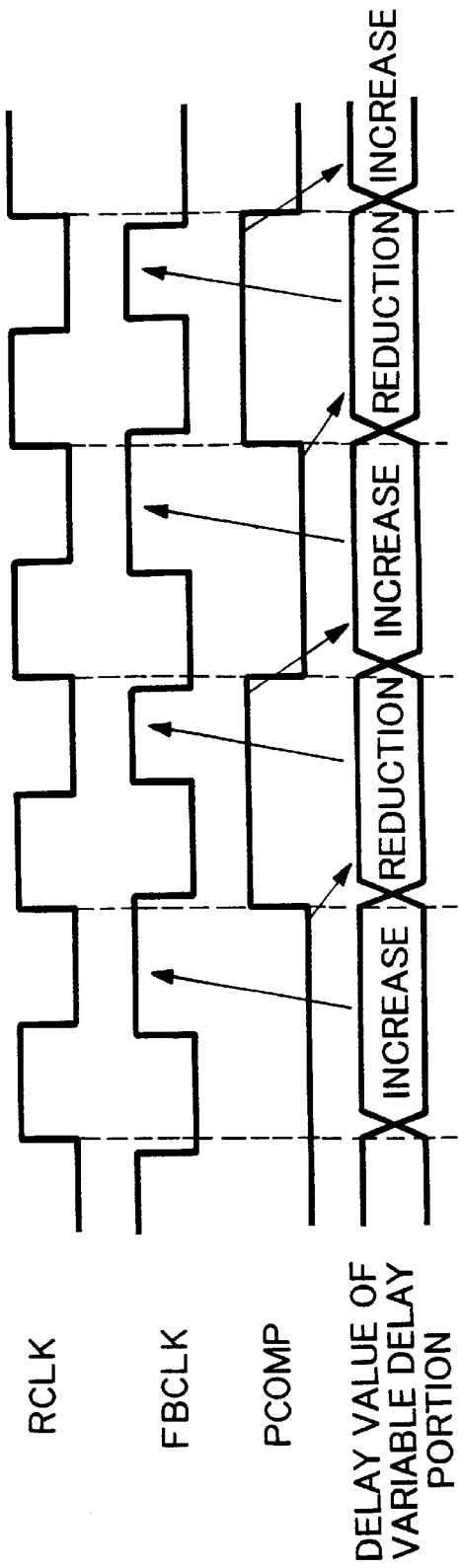
FIG.2C (PRIOR ART)

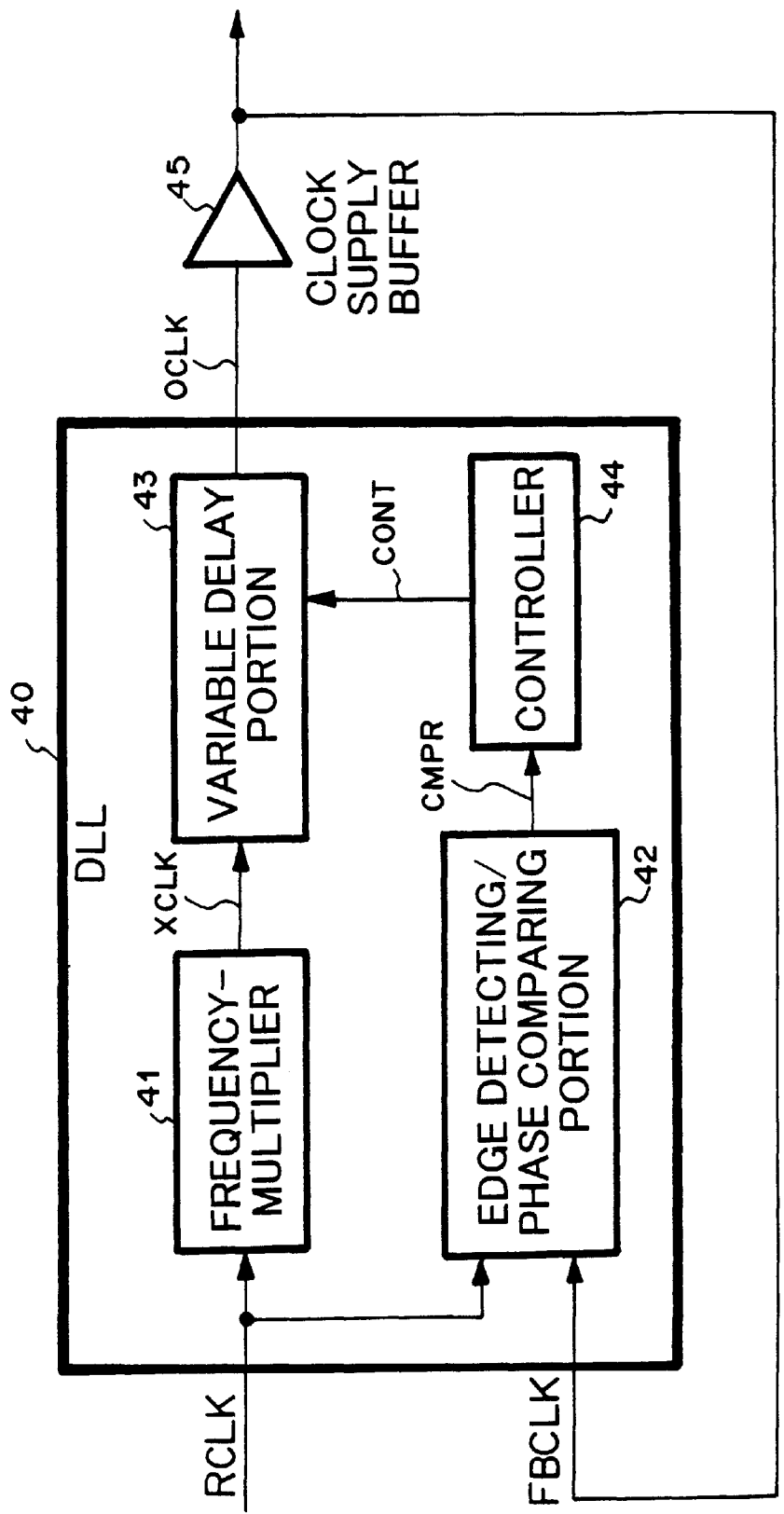

DELAY LOCKED LOOP CIRCUIT FOR SYNCHRONIZING INTERNAL SUPPLY CLOCK WITH REFERENCE CLOCK

BACKGROUND OF THE INVENTION

1. Field of the Invention

The present invention relates to a DLL (Delay Locked Loop) circuit for adjusting the delay amount on the basis of the phase comparison result between an internal supply clock and a reference clock to synchronize the internal supply clock with the reference clock.

2. Description of the Prior Art

Recent, increase in circuit scale of integrated circuits have caused delay of clock signals supplied into the integrated circuits (hereinafter referred to as internal clocks), and as the operating speed of the integrated circuits is increased, the possibility of occurrence of malfunction due to the phase delay of the internal clocks with respect to reference clocks is increased. In such a condition, a PLL (Phase Locked Loop) circuit, a DLL (Delay Locked Loop) circuit have been broadly used to synchronize the reference clocks and the internal clocks in phase. Particularly, the DLL circuit adjusts the phase through digital processing, and thus it has an advantage that it has higher resistance to noises occurring in surrounding circuits than the PLL circuit which adjusts the phase in an analog style by using a voltage control oscillator or the like, and it can be easily designed.

FIG. 1 is a block diagram showing a DLL circuit described in Japanese Laid-open Patent Publication No. Hei-10-270998.

The conventional DLL circuit 81 comprises phase comparator 82 for comparing the phase of reference clock RCLK with the phase of feedback clock FBCLK and outputting phase comparison result PCOMP, variable delaying portion 83 for increasing/reducing the delay amount of the reference clock RCLK on the basis of control signal CONT and outputting the delay-increased/reduced clock as output clock OCLK, and controller 84 for generating and outputting the control signal CONT on the basis of the phase comparison result PCOMP. The output clock OCLK is input to clock supply buffer 85, and the output of the clock supply buffer 85 is supplied into an internal circuit (not shown) as an internal clock, and also input into the phase comparator 82 as the feedback clock FBCLK.

FIG. 2A is a circuit diagram showing the phase comparator 82.

The phase comparator 82 comprises flip flop (hereinafter referred to as "FF") 91, and it reads out the feedback clock FBCLK in synchronism with the rise-up of the reference clock RCLK, and outputs the phase comparison result PCOMP. As shown in a phase-advance/phase-delay judging diagram of FIG. 2B, the controller 84 judges that the feedback clock FBCLK is under a phase-advanced state with respect to the reference clock RCLK if the phase judgment result PCOMP is equal to logic "1", and increases the delay amount of a variable delay portion 83 at the next clock time to delay the phase of the output clock OCLK. Likewise, if the phase judgment result PCOMP is equal to logic "0", the controller 84 judges that the feedback clock FBCLK is under a phase-delayed state with respect to the reference clock RCLK, and reduces the delay amount of the variable delay portion 83 at the next clock time to advance the phase of the output clock OCLK. By adjusting the phase as described above, the DLL circuit 81 can synchronize the phase of the feedback clock FBCLK (this clock is also a clock to be input into an integrated circuit) with the phase of the reference clock RCLK. Under the phase synchronized state, the phase comparison result PCOMP repetitively takes each of logic "1" and logic "0".

However, in the conventional DLL circuit described above, there occurs a faked synchronization state in which the phase synchronizing operation is stagnant under the state that the rise-up of the reference clock RCLK is coincident with the falling of the feedback clock FBCLK, and this faked synchronization state may disturb quick shift to a normal phase synchronized state.

FIG. 2C is an operation timing chart under the faked synchronized state.

In a case where the phase comparison result PCOMP is varied from the logic "1" to the logic "0" (or from the logic "0" to the logic "1") due to some factor (occurrence of jitter in the reference clock or the like) when the rise-up of the reference clock RCLK is substantially coincident with the falling of the feedback clock FBCLK, the phase comparison result PCOMP is repetitively and alternately switched between the logic "1" and the logic "0" as shown in FIG. 2C because there is a time delay between the phase comparison operation and the delay amount control operation, so that there occurs a faked synchronized state in which the phase synchronizing operation is stagnant under the state that the reference clock RCLK and the feedback clock FBCLK keep a phase difference of 180 degrees.

SUMMARY OF THE INVENTION

An object of the present invention is to provide a DLL circuit that can prevent occurrence of such a faked synchronization state, and implement a normal synchronization state stably and quickly.

In according with a first aspect of the present invention is provided a DLL circuit comprising: an edge detecting/phase comparing portion for receiving a first clock and a second clock, comparing the rise-up variations of the first and second clocks or the falling variations thereof every period of the first clock, internally generating an original comparison signal which is set to a first logical level when the variation of the second clock is prior to the variation of the first clock and is set to a second logical level when the variation of the second clock is subsequent to the variation of the first clock, and outputting the original comparison signal as a subsequent phase comparison result signal when it is detected that the level of the first clock and the level of the second clock have been varied in the same direction within a predetermined time, while keeping the output logical level of the phase comparison result signal and outputting the phase comparison result signal as a subsequent phase comparison result signal when it is detected that the level of the first clock and the level of the second clock have been varied in the opposite directions within the predetermined time; a variable delay portion for receiving the first clock, delaying the first clock on the basis of a control signal and outputting the delayed first clock as an output clock; and a controller for outputting the control signal which instructs the variable delay portion to increase the delay amount when the phase comparison result signal is set to the first logical level, and also instructs the variable delay portion to reduce the delay amount when the phase comparison result signal is set to the second logical level.

In according with a second aspect of the present invention is provided a DLL circuit comprising: a frequency multiplier for receiving a first clock and multiplying the frequency of the first clock to generate and output a frequency-multiplied clock; an edge detecting/phase comparing portion for receiving the first clock and the second clock, comparing the rise-up variations of the first and second clocks or the falling variations thereof every period of the first clock, internally generating an original comparison signal which is set to a first logical level when the variation of the second clock is prior to the variation of the first clock and is set to a second logical level when the variation of the second clock is subsequent to the variation of the first clock, and outputting the original comparison signal as a subsequent phase comparison result signal when it is detected that the level of the first clock and the level of the second clock have been varied in the same direction within a predetermined time, while keeping the output logical level of the phase comparison result signal and then outputting the phase comparison result signal as a subsequent phase comparison result signal when it is detected that the level of the first clock and the level of the second clock have been varied in the opposite directions within the predetermined time; a variable delay portion for receiving the frequency-multiplied clock, delaying the frequency-multiplied clock on the: basis of a control signal and outputting the delayed frequency-multiplied clock as an output clock; and a controller for outputting the control signal which instructs the variable delay portion to increase the delay amount when the phase comparison result signal is set to the first logical level, and also instructs the variable delay portion to reduce the delay amount when the phase comparison result signal is set to the second logical level.

In according with a third aspect of the present invention is provided a DLL circuit comprising: an edge detecting/phase comparing portion for receiving a first clock and a second clock, comparing the rise-up variations of the first and second clocks or the falling variations thereof every period of the first clock, outputting a phase comparison result signal which is set to a first logical level when the variation of the second clock is prior to the variation of the first clock and to a second logical level when the variation of the second clock is subsequent to the variation of the first clock, and outputting a phase selecting signal whose logical level is inverted every time it is detected that the level of the first clock and the level of the second clock have been varied in the opposite directions within a predetermined time; an input phase selecting circuit portion for receiving the first clock, generating an inverted signal, selecting the first clock and outputting it as a selected clock when the phase selecting signal is set to a predetermined logical level, while selecting an inverted signal of the first clock and then outputting the inverted signal as the selected clock when the phase selection signal has an inverted level of a predetermined logic level; a variable delay portion for receiving the selected clock, delaying the selected clock on the basis of a control signal and outputting the delayed selected clock,as an output clock; and a controller for outputting the control signal which instructs the variable delay portion to increase the delay amount when the phase comparison result signal is set to the first logical level, and also instructs the variable delay portion to reduce the delay amount when the phase comparison result signal is set to the second logical level.

BRIEF DESCRIPTION OF THE DRAWINGS

FIG. 2A is a circuit diagram showing a phase comparator of the conventional DLL circuit; FIG. 2B is a judgment diagram of phase advance/phase delay; and FIG. 2C is an operation timing chart of a faked synchronized state;

FIG. 7 is a block diagram showing a second embodiment according to the present invention;

DETAILED DESCRIPTION OF THE PREFERRED EMBODIMENTS

Preferred embodiments according to the present invention will be described hereunder with reference to the accompanying drawings.

Figure 3:
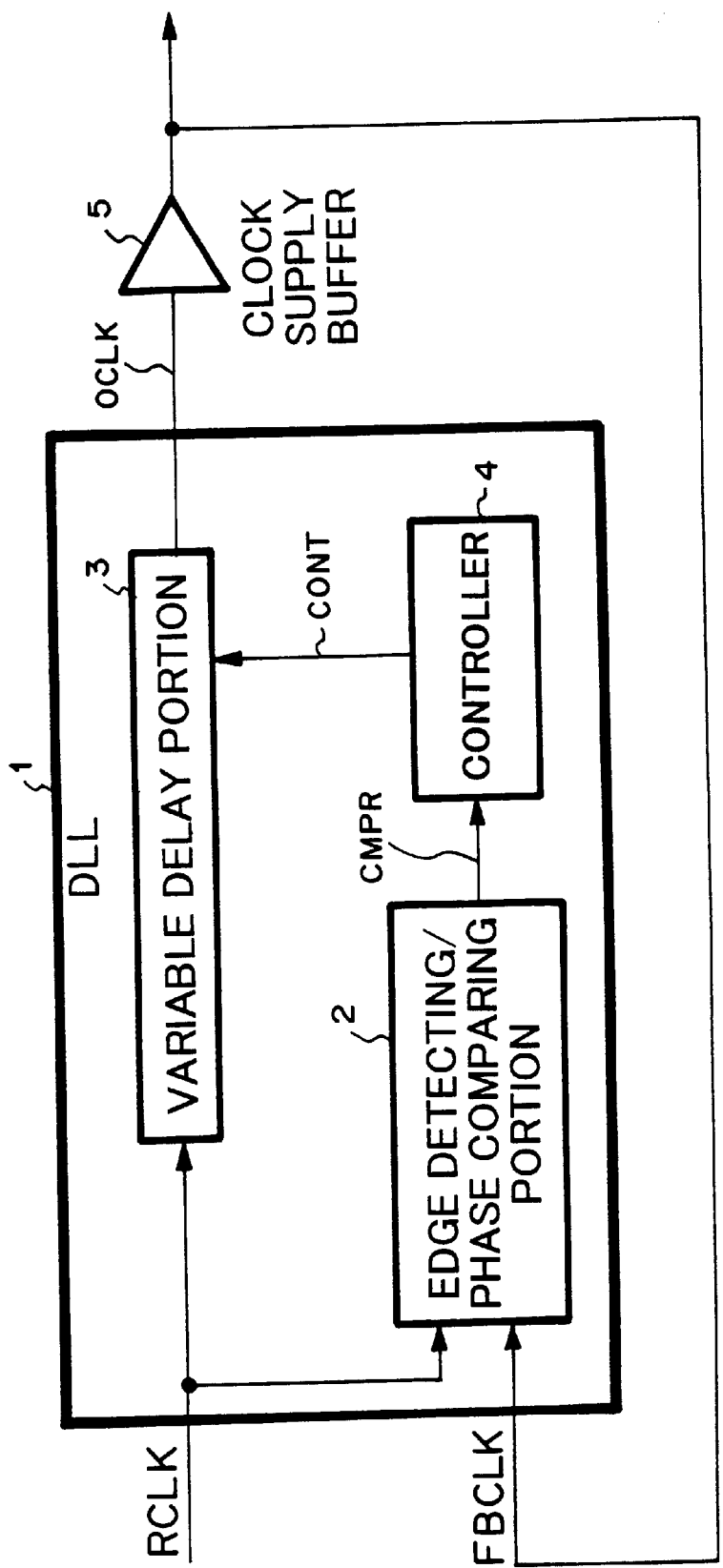
FIG. 3 is a block diagram showing a first embodiment of the present invention.

FIG. 3 is a block diagram showing a first embodiment of the present invention.

In FIG. 3, DLL circuit 1 receives reference clock RCLK serving as a first clock, and feedback clock FBCLK serving as a second clock, and outputs output clock OCLK. The output clock OCLK is input to clock supply buffer 5, and the output of the clock supply buffer 5 is supplied to an internal circuit (not shown) and also it serves as a feedback clock FBCLK. The DLL circuit 1 comprises edge detecting/phase comparing portion 2, variable delay portion 3 and controller 4. As in the case of the conventional DLL circuit shown in FIG. 1, the DLL circuit 1 synchronizes the phase between the reference clock RCLK and the feedback clock FBCLK.

The edge detecting/phase comparing portion 2 receives the reference clock RCLK and the feedback clock FBCLK, and compares the rise-up variations or falling variations of the reference clock RCLK and the feedback clock FBCLK every period of the reference clock RCLK to internally generate an original comparison signal that is set to logic "1" (first logical level) when the level variation of the feedback clock FBCLK is prior to the level variation of the reference clock RCLK or set to logic "0" (second logical level) when the level variation of the feedback clock FBCLK is subsequent to the level variation of the reference clock RCLK. When it is detected that the level of the reference clock RCLK and the level of the feedback clock signal FBCLK are varied in the same direction within a predetermined time T0, the original comparison signal is output as a subsequent phase comparison result CMPR. When it is detected that the level of the reference clock RCLK and the level of the feedback clock signal FBCLK are varied in the opposite directions within the predetermined time T0, the output logical level of the phase comparison result CMPR is kept and continuously output as a subsequent phase comparison result CMPR.

Figure 1:
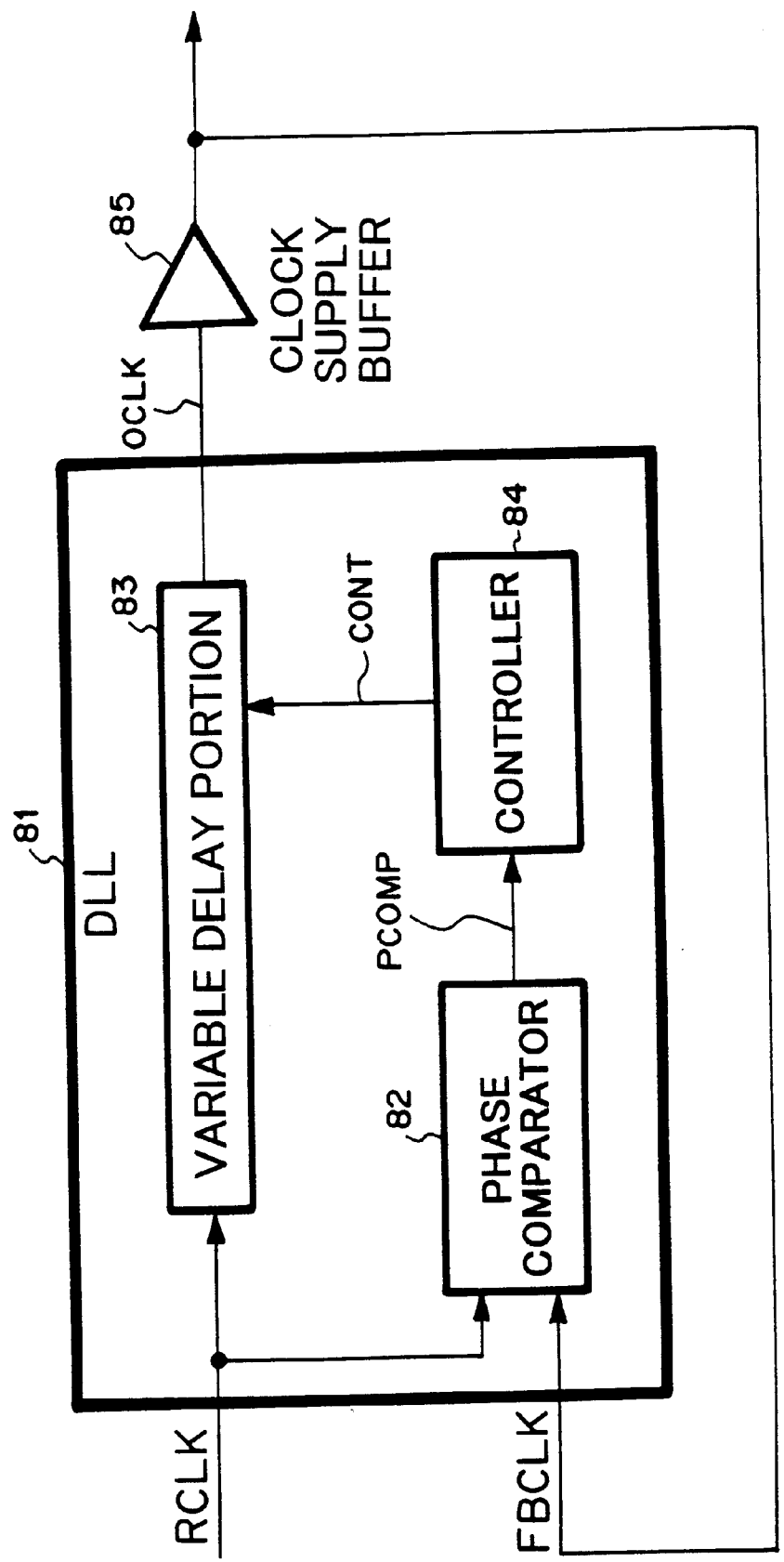
FIG. 1 is a block diagram showing a conventional DLL circuit.

Like the conventional circuit of FIG. 1, the variable delay portion 3 receives the reference clock RCLK, delays the reference clock RCLK thus input on the basis of a control signal, and outputs it as output clock OCLK.

Like the conventional circuit of FIG. 1, the controller 4 outputs a control signal CONT for instructing to increase the delay amount of the variable delay circuit 3 when the phase comparison result CMPR is logic "1", and also instructing to reduce the delay amount of the variable delay circuit 3 when the phase comparison result CMPR is logic "0".

Figure 4:
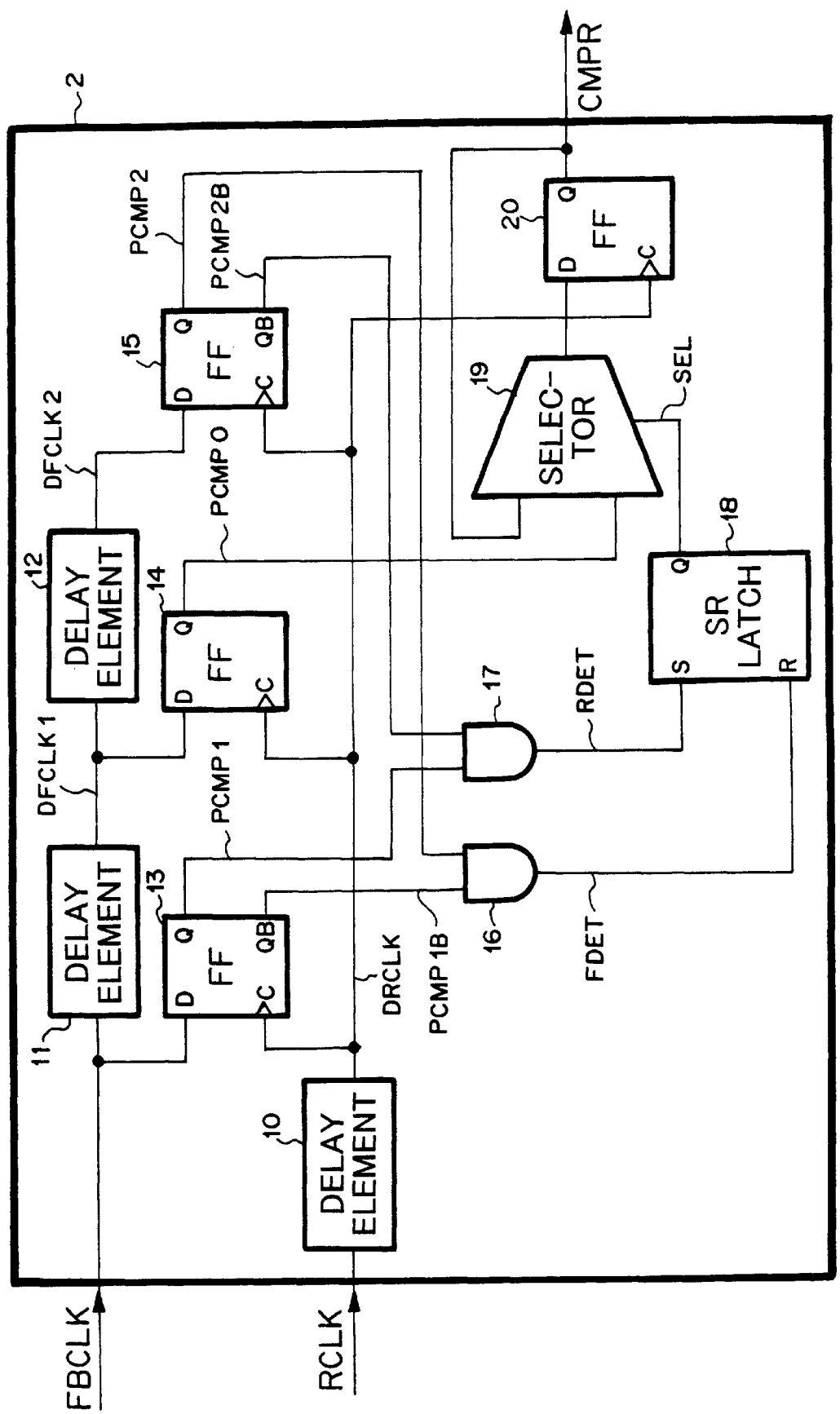
FIG. 4 is a circuit diagram showing an edge detecting/phase comparing portion of the first embodiment according to the present invention.

FIG. 4 is a circuit diagram showing the edge detecting/phase comparing portion 2 according to the first embodiment of the present invention.

The edge detecting/phase comparing portion 2 comprises first delay element 10 for receiving the reference clock RCLK and outputting delayed reference clock DRCLK, second delay element 11 for receiving the feedback clock FBCLK and outputting first delayed feedback clock DFCLK 1, third delay element 12 for receiving the first delayed feedback clock DFCLK 1 and outputting second delayed feedback clock DFCLK 2, first FF 13 for receiving the feedback clock FBCLK through data input terminal D and the delayed reference clock DRCLK through clock input terminal C, and outputting first comparison signal PCMP1 from positive side output terminal Q and the inverted signal PCMP1B of the first comparison signal PCMP1 from inversion side output terminal QB, second FF 14 for receiving the first delayed feedback clock DFCLK1 through data input terminal D and the delayed reference clock DRCLK through clock input terminal C, and outputting original comparison signal PCMP0 from positive side output terminal Q, and third FF 15 for receiving the second delayed feedback clock DFCLK 2 through data input terminal D and the delayed reference clock DRCLK through clock input terminal C, and outputting second comparison signal PCMP2 from positive side output terminal Q and the inverted signal PCMP2B of the second comparison signal PCMP2 from inversion side output terminal QB.

The edge detecting/phase comparing portion 2 comprises first AND circuit 16 that receives the second comparison signal PCMP2 and the inverted signal PCMP1B of the first comparison signal PCMP1, second AND circuit 17 that receives the first comparison signal PCMP1 and the inverted signal PCMP2B of the second comparison signal PCMP2, set/reset latch (abbreviated as SR latch) 18 that has set input terminal S connected to the output terminal of the second AND gate 17 and reset input terminal R connected to the output terminal of the first AND gate 16 and outputs selection signal SEL from the positive side output terminal, a selector 19 that receives the original comparison signal PCMP0 and the phase comparison result CMPR, and selects and outputs the original comparison signal PCMP0 when the selection signal SEL is logic "1", or selects and outputs the phase comparison result CMPR when the selection signal SEL is logic "0", and fourth FF 20 that has data input terminal D connected to the output terminal of the selector 19, receives the delayed reference clock DRCLK through clock input terminal C and outputs phase comparison result CMPR from the positive side output terminal.

In FIG. 4, it is assumed that the delay elements 10, 11, 12 have the same delay time D.

In the edge detecting/phase comparing portion 2, the before-and-after relationship of the variation of the reference clock RCLK and the variation of the feedback clock FBCLK is converted to the before-and-after relationship of the variation of the delayed reference clock DRCLK and the variation of the first delayed reference clock DFCLK1, and detected in the second FF 14. The second FF 14 corresponds to FF 91 of the conventional circuit of FIG. 2A. The original comparison signal PCMP0 output from the positive side output Q of the second FF 14 is set to logic "1" when the rise-up variation of the feedback clock FBCLK is prior to the rise-up variation of the reference clock RCLK, and it is set to logic "0" when the rise-up variation of the feedback clock FBCLK is subsequent to the rise-up variation of the reference clock RCLK.

The first FF 13 judges the signal level of the feedback clock FBCLK at the time subsequent to the rise-up variation time of the reference clock RCLK by a delay time D, and the third FF 15 judges the signal level of the feedback clock FBCLK at the time prior to the: rise-up variation time of the reference clock RCLK by a delay time D. Accordingly, when the feedback clock FDCLK is varied so as to fall within a predetermined time T=2D with the rise-up variation of the reference clock RCLK;at the center of the predetermined time T, the falling detection signal FDET corresponding to the output of the first AND circuit 16 is set to logic "1". Likewise, when the feedback clock FDCLK is varied so as to rise up within a predetermined time T=2D with the rise-up variation of the reference clock RCLK at the center of the predetermined time T, the rise-up detection signal RDET corresponding to the output of the second AND circuit 17 is set to logic "1".

When the falling detection signal FDET is varied to logic "1" under the state that the rise-up detection signal RDET is set to logic "0", the SR latch 18 is reset, and the selection signal SEL is set to logic "0" to select the phase comparison result CMPR, so that the phase comparison result CMPR corresponding to the output of the edge detecting/phase comparing portion 2 continues to keep the logical level that has been output until now. Accordingly, under the state that the rise-up of the. reference clock RCLK and the falling of the feedback clock FBCLK are substantially coincident with each other, the output level that has been output until now is kept as the phase comparison result CMPR irrespective of the original comparison signal. Therefore, the one-way delay control is carried out in the controller 4 and the variable delay portion 3, and thus a faked synchronization state can be prevented from occurring.

On the other hand, when the rise-up detection signal RDET is varied to logic "1" under the state that the falling detection signal FDET is set to logic "0", the SR latch 18 is set, and the selection signal SEL is set to logic "1" to select the original comparison signal PCMPO. Therefore, according to the comparison result of the second FF 14, the phase comparison result CMPR corresponding to the output of the edge detecting/phase comparing portion 2 is set to logic "0" under the phase-delayed state, and also set to logic "1" under the phase-advanced state. Accordingly, under the state that the rise-up of the reference clock RCLK and the rise-up of the feedback clock FBCK are substantially coincident with each other (hereinafter referred to as "coincident state"), the delay control is carried out so that the delay amount is increased in the controller 4 and the variable delay portion 3 when the phase advance is increased with respect to the phase under the coincident state, and the delay control is carried out so that the delay amount is reduced in the controller 4 and the variable delay portion 3 when the phase delay is increased with respect to the phase under the coincident state.

Figure 5:
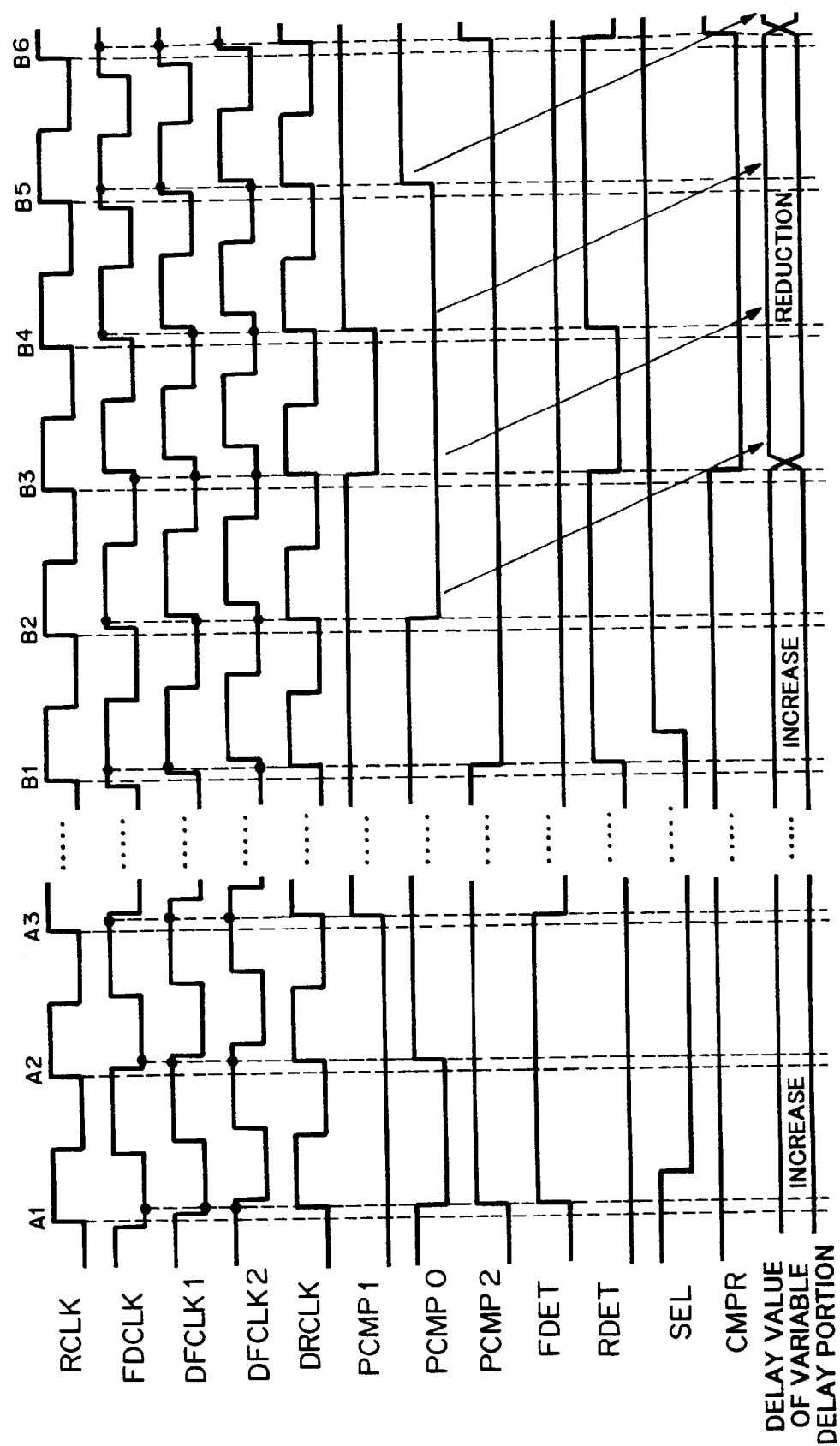
FIG. 5 is an operation timing chart of the edge detecting/phase comparing portion of FIG. 4.

FIG. 5 is an operation timing chart of the edge detecting/phase comparing portion 2 of FIG. 4.

A1 to A3 of FIG. 5 show a case where the original comparison signal PCMP is varied from logic "1" to logic "0" due to some factor when the rise-up of the reference clock RCLK and the falling of the feedback clock FBCLK are substantially coincident with each other under a condition similar to the condition under which the faked synchronization state occurs in the conventional circuit of FIG. 1. The original comparison signal PCMP is varied from logic "1" to logic "0" and then varied to logic "1" again. However, since the falling detection signal FDET is varied to logic "1" at the timing of A1, the phase comparison result CMPR keeps logic "1", so that the delay control of increasing the delay amount of the variable delay portion 3 is continued by the controller 4. Accordingly, occurrence of the faked synchronization state is prevented at A1 to A3.

B1 to B6 of FIG. 5 show the operation in the vicinity of the synchronization state under which the rise-up of the reference clock RCLK and the rise-up of the feedback clock FBCLK are substantially coincident with each other. Since the rise-up detection signal RDET is varied to logic "1" at the timing of B1, the variation of the signal of the original comparison signal PCMPO is output as the variation of the phase comparison result CMPR from the edge detecting/phase comparing portion 2. Under the phase synchronized state, the phase comparison result CMPR is varied from logic "0" to logic "1" or varied from logic "1" to logic "0" every three clocks as shown at the timing of B3 to B6, and the increase/reduction of the delay amount in the variable delay portion 3 is repeated to thereby keep the synchronization.

Figure 6:
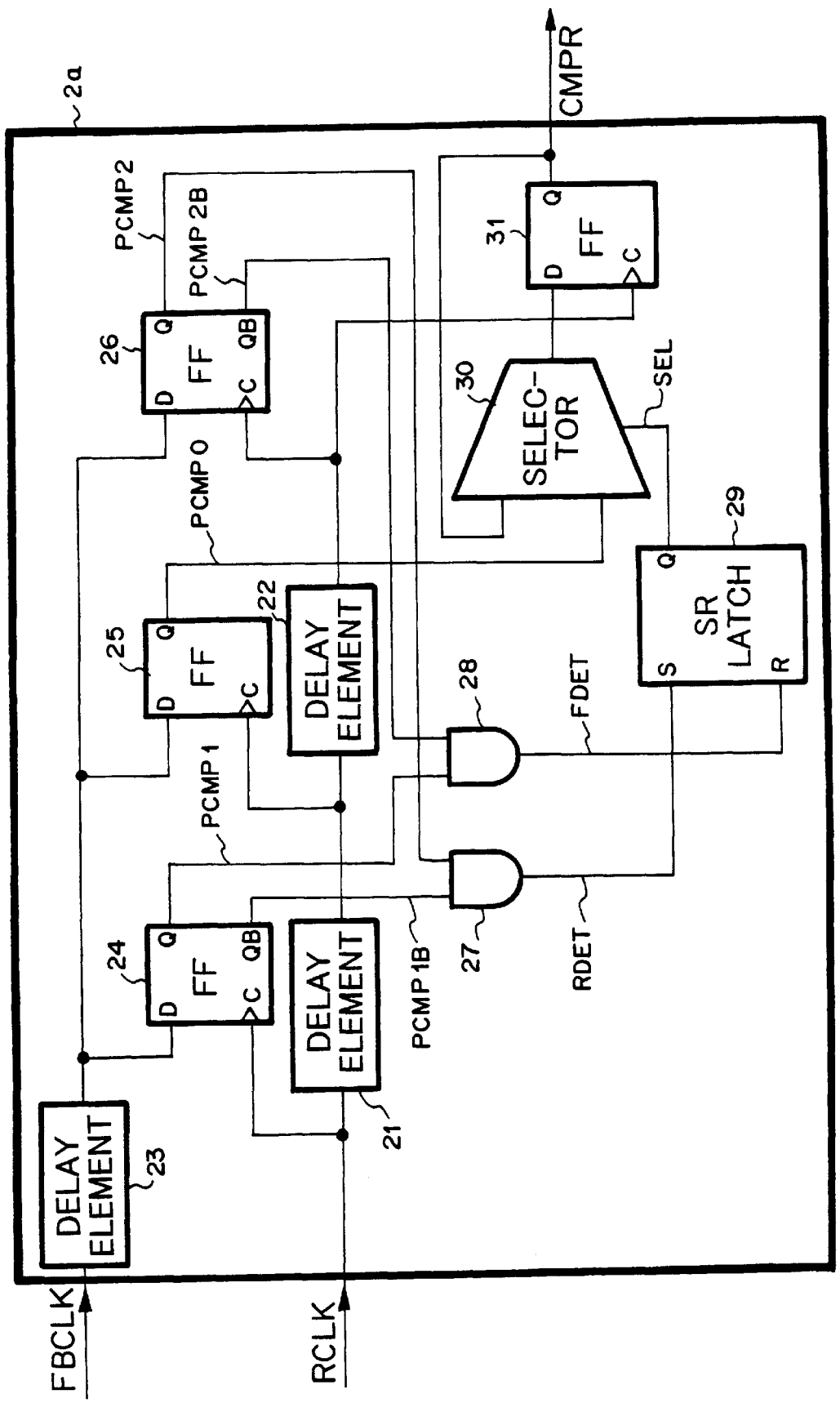
FIG. 6 is a circuit diagram according to another edge detecting/phase comparing portion of the first embodiment according to the present invention.

FIG. 6 is a circuit diagram showing another edge detecting/phase comparing portion of the first embodiment according to the present invention.

Edge detecting/phase comparing portion 2a comprises first delay element 21 having the input terminal to which the reference clock RCLK is input, second delay element 22 having the input terminal connected to the output terminal of the first delay element 21, third delay element 23 having the input terminal to which the feedback clock FBCLK is input, first FF 24 having data input terminal D connected to the output terminal of the third delay element 23, clock input terminal C to which the reference clock RCLK is input, positive side output terminal Q from which a first comparison signal PCMP1 is output, and inversion side output terminal QB from which the inverted signal PCMP1B of the first comparison signal PCMP1 is output, second FF 25 having data input terminal D connected to the output terminal of the third delay element 23, clock input terminal C connected to the output terminal of the first delay element 21 and positive side output terminal Q from which the original comparison signal PCMPO is output, third FF 26 having data input terminal D connected to the output terminal of the third delay element 23, clock input terminal C connected to the output terminal of the second delay element 22, positive side output terminal Q from which second comparison signal PCMP2 is output, and inversion side output terminal QB from which the inverted signal PCMP2B of the second comparison signal PCMP2 is output, first AND circuit 27 that receives the second comparison signal PCMP2 and the inverted signal PCMP1B of the first comparison signal PCMP1 and outputs a rise-up detection signal RDET, second AND circuit 28 that receives the first comparison signal PCMP1 and the inverted signal PCMP2B of the second comparison signal PCMP2 and outputs falling detection signal FDET, SR latch 29 having set input terminal S connected to the output terminal of the first AND gate 27, reset input terminal R connected to the output terminal of the second AND gate 28 and positive side output terminal from which selection signal SEL is output, selector 30 that receives the original comparison signal PCMP0 and the phase comparison result CMPR, and selects/outputs the original comparison signal PCMP0 when the selection signal SEL is set to logic "1" and selects/outputs the phase comparison result CMPR when the selection signal SEL is set to logic "0", and fourth FF 31 having data input terminal D connected to the output terminal of the selector 30, clock input terminal C connected to the output terminal of the second delay element 22 and positive side output terminal from which the phase comparison result CMPR is output. The delay elements 21, 22 and 23 of FIG. 6 are assumed to have the same delay time D.

Since the arrangement connection of the delay elements at the reference clock side and feedback clock side in the edge detecting/phase comparing portion 2 of FIG. 4 is changed in the edge detecting/phase comparing portion 2a of FIG. 6, the work of the first FF 13 of FIG. 4 is performed by the third FF 26 of FIG. 6, and the work of the third FF 15 of FIG. 4 is performed by the first FF 24 of FIG. 6. The details and effects of the operations other than the above operation are the same as described with reference to FIGS. 4 and 5, and thus the duplicative description thereof is omitted.

Next, a second embodiment according to the present invention will be described. FIG. 7 is a block diagram showing the second embodiment. DLL circuit 40 of the second embodiment has frequency-multiplier 41, edge detecting/phase comparing portion 42, variable delay portion 43 and controller 44.

The frequency-multiplier 41 receives the reference clock RCLK and multiplies the frequency of the reference clock RCLK to generate and output frequency-multiplied clock XCLK.

The edge detecting/phase comparing portion 42 receives the reference clock RCLK and the feedback clock FBCLK, compares the rise-up variations or falling variations of the reference clock RCLK and the feedback clock BCLK every period of the reference clock RCLK, internally generates an original comparison signal that is set to a logic "1" as a first logical level when the variation of the feedback clock FBCLK is prior to the variation of the reference clock RCLK or set to a logic "0" as a second logical level when the variation of the feedback clock FBCLK is subsequent to the variation of the reference clock RCLK, outputs the original comparison signal as a subsequent phase comparison result signal CMPR when it is detected that the level of the reference clock RCLK and the level of the feedback clock FBCLK are varied in the same direction within a predetermined time T0, or keeps the output logical level of the phase comparison result signal RCLK when the level of the reference clock RCLK and the level of the feedback clock FBCLK are varied in the opposite directions within the predetermined time T0 and outputs the phase comparison result signal RCLK as a subsequent phase comparison result signal CMPR.

The variable delay portion 43 receives the frequency-multiplied clock XCLK, delays it on the basis of the control signal CONT and then outputs the signal thus delayed as an output clock OCLK.

The controller 44 outputs a control signal that instructs the variable delay circuit 43 to increase the delay amount when the phase comparison result signal RCLK is set to logic "1" and also to reduce the delay amount when the phase comparison result signal RCLK is set to logic "0".

As in the case of the first embodiment, the output clock OCLK is input to the clock supply buffer 45, the output of the clock supply buffer 45 is supplied to the internal circuit (not shown) and also serves as a feedback clock FBCLK, and the reference clock RCLK and the feedback clock FBCLK are synchronized in phase with each other by the DLL circuit 40. However, this embodiment is different from the first embodiment in that the frequency of the feedback clock FBCLK which is also supplied to the internal circuit as an internal clock is a high-speed clock obtained by multiplying the frequency of the reference clock RCLK.

In the DLL circuit 40, occurrence of the faked synchronization state in which the phase synchronizing operation is stagnant while the rise-up of the reference clock RCLK and the falling of the feedback clock FBCLK are substantially coincident with each other can be prevented by the action of the edge detecting/phase comparing portion 42.

Figure 8A:
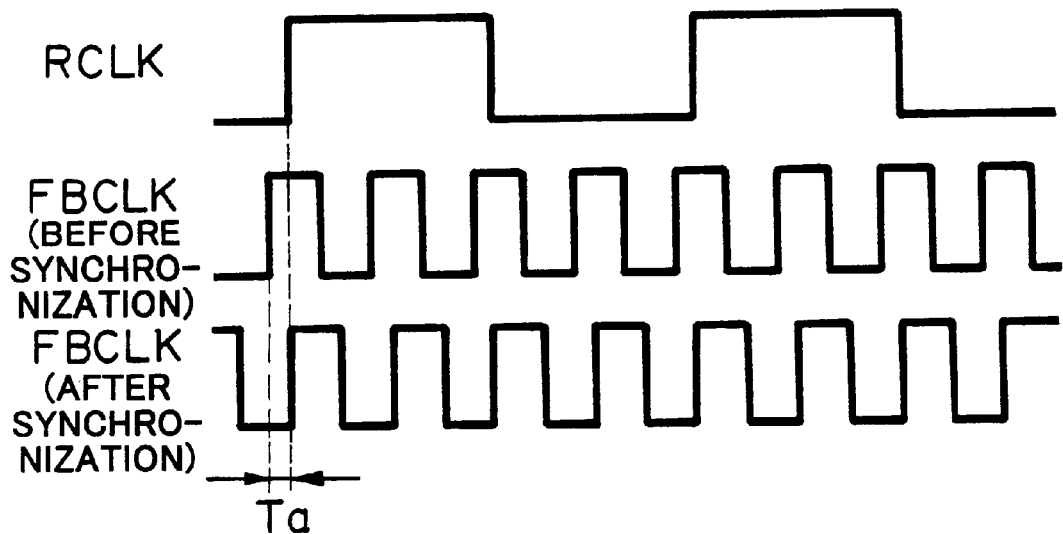
FIG. 8A is a waveform diagram before and after synchronization is established.
Figure 8B:
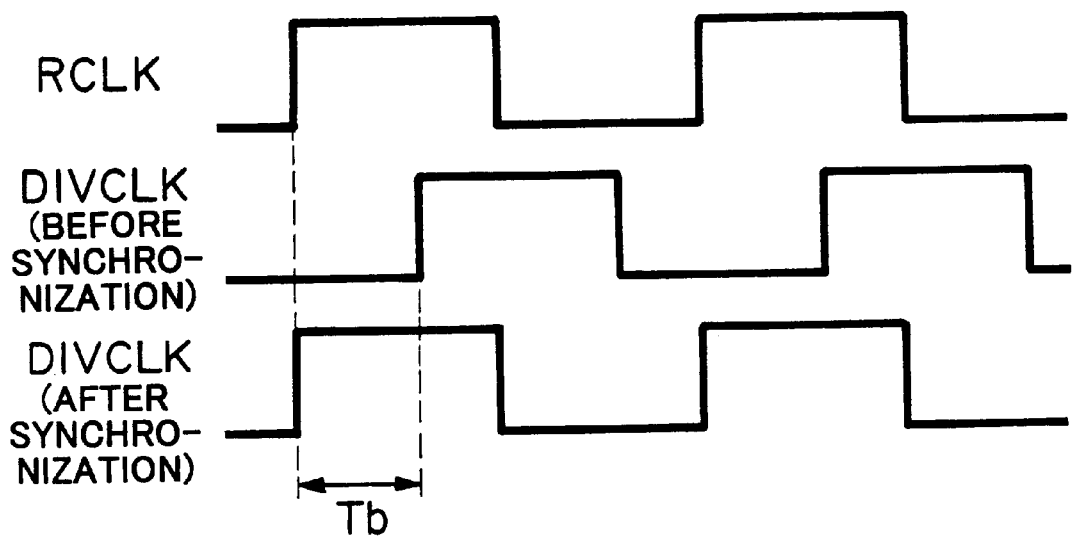
FIG. 8B is a waveform diagram when a frequency-divider is provided.

As shown in the waveform diagram of FIG. 8A before and after the synchronization, the delay amount required to match the phase (Ta in FIG. 8A) can be reduced in the DLL circuit 40, so that the circuit scale of the variable delay portion can be reduced. On the other hand, even if the output of the clock supply buffer 45 is passed through a frequency-divider to be converted to a frequency-divided feedback clock DIVCLK having the same frequency as the reference clock RCLK and then the frequency-divided feedback clock DIVCLK is input to the edge detecting/phase comparing portion 42, the same effect of preventing occurrence of the faked phase synchronization state as described above could be achieved. However, as shown in FIG. 8B, the delay amount required to match the phase (Tb in FIG. 8B) is increased, and this is a disadvantage from the viewpoint of the circuit scale of the variable delay portion.

The edge detecting/phase comparing portion 2 of FIG. 4 or the edge detecting/phase comparing portion 2a of FIG. 6 can be directly used as a detailed circuit of the edge detecting/phase comparing portion 42.

The foregoing DLL circuit 40 is designed so that the frequency-multiplier 41 is disposed at the front stage of the variable delay circuit 43. However, the frequency-multiplier 41 may be disposed between the variable delay circuit 43 and the clock supply buffer 45.

Figure 9:
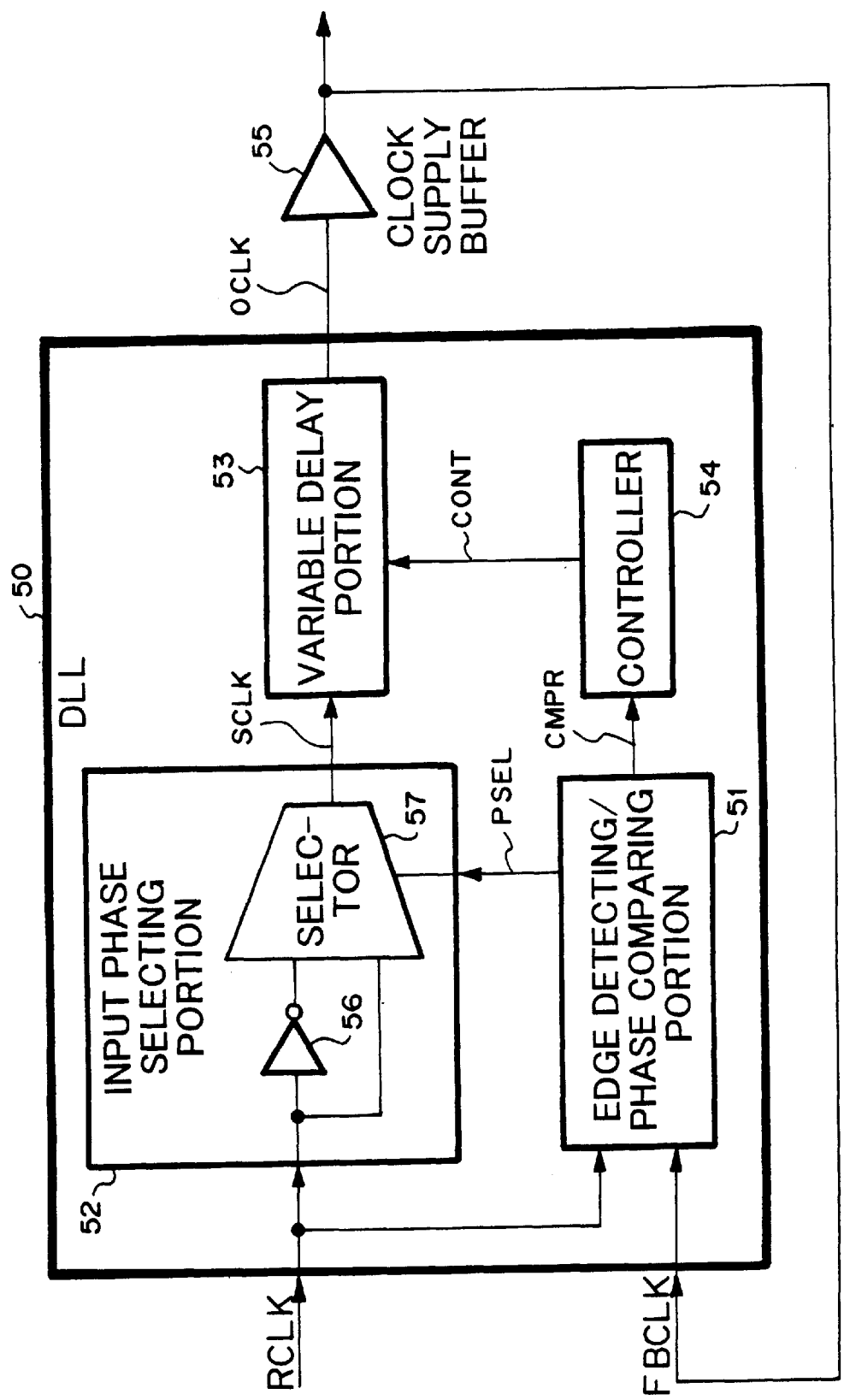
FIG. 9 is a block diagram showing a third embodiment of the present invention.

Next, a third embodiment according to the present invention will be described. FIG. 9 is a block diagram showing the third embodiment of the present invention. In the third embodiment, DLL circuit 50 comprises an edge detecting/phase comparing portion 51, input phase selecting portion 52, variable delay portion 53 and controller 54.

The edge detecting/phase comparing portion 51 receives the reference clock RCLK and the feedback clock FBCLK, and compares the rise-up variations or falling variations of the reference clock RCLK and the feedback clock FBCLK every period of the reference clock RCLK. Further, the edge detecting/phase comparing portion 51 outputs a phase comparison result CMPR that is set to logic "1" (first logical level) when the variation of the feedback clock FBCLK is prior to the variation of the reference clock RCLK and set to logic "0" (second logical level) when the variation of the feedback clock FBCLK is subsequent to the variation of the reference clock RCLK, and phase selecting signal PSEL whose logical level is inverted every time it is detected that the level of the reference clock RCLK and the level of the feedback clock FBCLK are varied in the opposite directions within a predetermined time T0.

The input phase selecting circuit portion 52 comprises an inverter circuit 56 for receiving the reference clock RCLK and generating the inverted signal thereof, and selector 57 for outputting the reference clock RCLK as selection clock SCLK when the phase selecting signal PSEL is the logic "1" corresponding to a predetermined logical level and outputting the output signal of the inverter circuit 56 as the selection clock SCLK when the phase selecting signal PSEL is the logic "0" corresponding to the inverted level of a predetermined logical level.

The variable delay portion 53 receives the selection clock SCLK and delays the selection clock SCLK on the basis of the control signal CONT, and outputs it as the output clock OCLK.

The controller 54 outputs a control signal CONT for instructing the variable delay circuit 53 to increase the delay amount when the phase comparison result CMPR is logic "1" (first logical level), and to reduce the delay amount when the phase comparison result CMRP is logic "0" (second logical level).

As in the case of the first embodiment of FIG. 3, the output clock OCLK is input to the clock supply buffer 55, the output of the clock supply buffer 55 is supplied to the internal circuit (not shown) and also serves as a feedback clock FBCLK, and the reference clock RCLK and the feedback clock FBCLK are synchronized in phase with each other by the DLL circuit 50. However, this embodiment is different from the first embodiment in that when the falling of the feedback clock FBCLK is detected within a predetermined time period with the rise-up of the reference clock RCLK at the center of the time period, the phase of the reference clock is varied by 180 degrees by the action of the input phase selecting portion 52. Accordingly, occurrence of the faked phase synchronization state can be prevented, and the shift from the state under which the phase difference is about 180 degrees to the phase synchronized state can be rapidly quickly promoted.

Figure 10:
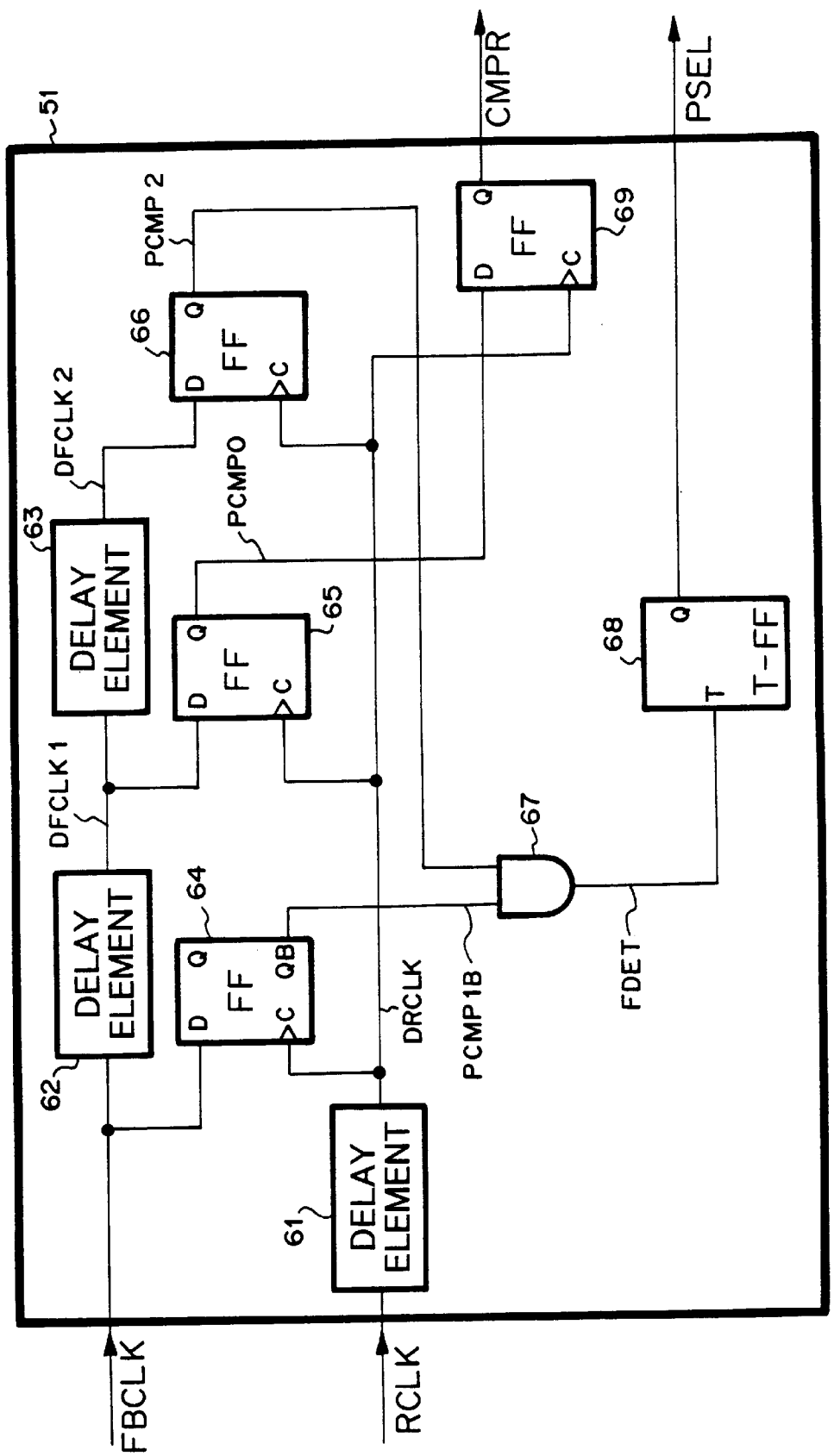
FIG. 10 is a circuit diagram showing an edge detecting/phase comparing portion according to the third embodiment of the present invention.

FIG. 10 is a circuit diagram showing an edge detecting/phase comparing portion 51 of the third embodiment of the present invention.

The edge detecting/phase comparing portion 51 comprises first delay element 61 for receiving the reference clock RCLK and outputting delayed reference clock DRCLK, second delay element 62 for receiving the feedback clock FBCLK and outputting first delayed feedback clock DFCLK1, third delay element 63 for receiving the first delayed feedback clock DFCLK1 and outputting second delayed feedback clock DFCLK2, first FF 64 that receives the feedback clock FBCLK through data input terminal D and the delayed reference clock DRCLK through clock input terminal C and outputs the inverted signal PCMP1B of the first comparison signal PCMP1 from inversion side output terminal QB, second FF 65 for receiving the first delayed feedback clock DFCLK1 through data input terminal D and the delayed reference clock DRCLK through clock input terminal C and outputting original comparison signal PCMP0 from positive side output terminal Q, and third FF 66 for receiving the second delayed feedback clock DFCLK2 through data input terminal D and the delayed reference clock DRCLK through clock input terminal C and outputting second comparison signal PCMP2 from positive side output terminal Q.

Further, the edge detecting/phase comparing portion 51 comprises AND circuit 67 for receiving the inverted signal PCMP1B of the first comparison signal PCMP1 and the second comparison signal PCMP2 and outputting falling detection signal FDET, toggle type FF (abbreviated as T-FF) 68 for receiving the falling detection signal FDET through input terminal T and outputting phase selecting signal PSEL from positive side output terminal Q, and fourth FF 69 for receiving the original comparison signal PCMP0 through data input terminal D and the delayed reference signal DRCLK through clock input terminal C and outputting phase comparison result OMPR from positive output terminal Q.

In FIG. 10, the delay elements 62, 63 and 64 are assumed to have the same delay time D.

In the edge detecting/phase comparing portion 51, when the falling of the feedback clock FBCLK exists within a predetermined time T0=2D containing the rise-up of the reference clock RCLK at the center thereof, the falling detection signal FDET is set to logic "1", and the phase selecting signal PSEL which is the output of T-FF 68 inverts its logical level. As a result, the different input from the input being selected as the output until now is output as a selection clock SCLK from the input phase selecting portion 52.

Figure 11:
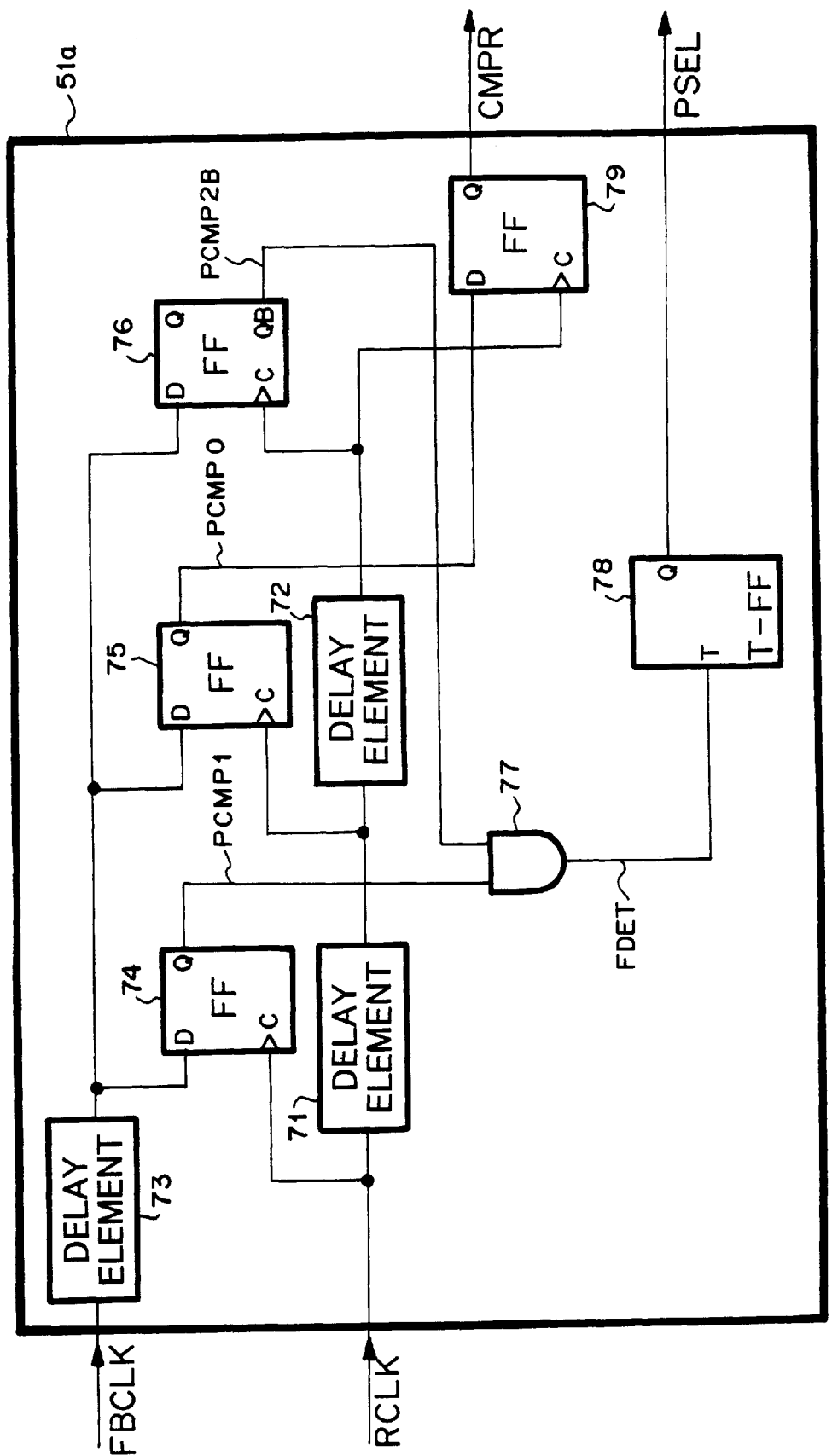
FIG. 11 is a circuit diagram showing another edge detecting/phase comparing portion of the third embodiment according to the present invention.

FIG. 11 is a circuit diagram showing another edge detecting/phase comparing portion of the third embodiment.

The edge detecting/phase comparing portion 51a comprises first delay element 71 for receiving the reference clock RCLK through the input terminal thereof, second delay element 72 having the input terminal connected to the output terminal of the first delay element 71, third delay element 73 having the input terminal to which the feedback clock FBCLK is input, first FF 74 that has data input terminal D connected to the output terminal of the third delay element 73 and clock input terminal C to which the reference clock RCLK is input, and outputs first comparison signal PCMP1 from positive side output terminal Q, second FF 75 that has data input terminal D connected to the output terminal of the third delay element 73 and clock input terminal C connected to the output terminal of the first delay element 71, and outputs original comparison signal PCMP0 from positive side output terminal Q, third FF 76 that has data input terminal D connected to the output terminal of the third delay element 73 and clock input terminal C connected to the output terminal of the second delay element 72 and outputs the inverted signal PCMP2B of the second comparison signal PCMP2 from inversion side output terminal QB, AND circuit 77 that receives the first comparison signal PCMP1 and the inverted signal PCMP2B of the second comparison signal PCMP2 and outputs falling detection signal FDET, T-FF 78 that has input terminal T to which the falling detection signal FDET is input, and outputs phase selecting signal PSEL from positive side output terminal Q, and fourth FF 79 that has data input terminal D to which the original comparison signal PCMPO is input and clock input terminal C connected to the output terminal of the second delay element 72, and outputs phase comparison result OMPR from positive side output terminal Q.

In the edge detecting/phase comparing portion 51a of FIG. 11, since the arrangement connection of the delay elements at the reference clock side and the feedback clock side in the edge detecting/phase comparing portion 51 of FIG. 10 is changed, the work of the first FF 64 of FIG. 10 is carried out by the third FF 76 of FIG. 11, and the work of the third FF 66 of FIG. 10 is carried out by the first FF 74 of FIG. 11. The other operations and effects are the same as the embodiment of FIG. 10, and thus the description thereof is omitted.

In the DLL circuit 50 of FIG. 9, the input phase selecting portion 52 is disposed at the front stage of the variable delay circuit 53, however, it may be disposed between the variable delay circuit 53 and the clock supply buffer 55.

As described above, by applying the present invention, even when the rise-up of the reference clock RCLK and the falling of the feedback clock FBCLK are substantially incident with each other, the phase synchronizing operation can be prevented from being stagnant due to occurrence of a faked synchronization state, so that a normal synchronization state can be stably and quickly achieved.

Further, according to the second embodiment of the present invention, in addition to the effect of stabilizing the phase synchronization with the frequency-multiplied clock and quickly implementing the normal synchronization state, the circuit scale of the variable delay portion can be reduced.

According to the third embodiment of the present invention, in addition to the effect of avoiding occurrence of the faked synchronization state, the phase synchronizing operation can be greatly promoted particularly when the phase difference between the reference clock and the feedback clock is equal to about 180 degrees.

What is claimed is:

1. A DLL circuit, comprising:
an edge detecting/phase comparing portion for receiving a first clock and a second clock, comparing the rise-up variations of the first and second clocks or the falling variations thereof every period of the first clock, internally generating an original comparison signal which is set to a first logical level when the variation of the second clock is prior to the variation of the first clock and is set to a second logical level when the variation of the second clock is subsequent to the variation of the first clock, and outputting the original comparison signal as a subsequent phase comparison result signal when it is detected that the level of the first clock and the level of the second clock have been varied in the same direction within a predetermined time, while keeping the output logical level of the phase comparison result signal and outputting the phase comparison result signal as a subsequent phase comparison result signal when it is detected that the level of the first clock and the level of the second clock have been varied in the opposite directions within the predetermined time;
a variable delay portion for receiving the first clock, delaying the first clock on the basis of a control signal and outputting the delayed first clock as an output clock; and
a controller for outputting the control signal which instructs said variable delay portion to increase the delay amount when the phase comparison result signal is set to the first logical level, and also instructs said variable delay portion to reduce the delay amount when the phase comparison result signal is set to the second logical level.

2. The DLL circuit as claimed in claim 1, wherein said edge detecting/phase comparing portion comprises:
a first delay element having an input terminal to which the first clock is input;
a second delay element having an input terminal to which the second clock is input;
a third delay element having an input terminal connected to the output terminal of said second delay element;
a first flip flop having a data input terminal to which the second clock is input, and having a clock input terminal connected to the output terminal of the first delay element;
a second flip flop having a data input terminal connected to the output terminal of said second delay element, an clock input terminal connected to the output terminal of said first delay element and a positive side output terminal from which an original comparison signal is output;
a third flip flop having a data input terminal connected to the output terminal of said third delay element and a clock input terminal connected to the output terminal of said first delay element;

a first AND circuit having two input terminals connected to the positive side output terminal of said third flip flop and the inversion side output terminal of said first flip flop, respectively;

a second AND circuit having two input terminals connected to the positive side output terminal of said first flip flop and the inversion side output terminal of said third flip flop, respectively;

a set/reset latch having a set input terminal connected to the output terminal of said second AND circuit, a reset input terminal connected to the output terminal of said first AND circuit and a positive side output terminal from which a selection signal is output;

a selector for receiving the original comparison signal and a phase comparison result signal, selecting the original comparison signal when the selection signal is logic "1" and the phase comparison result signal when the selection signal is logic "0", and then outputting the selected signal; and a fourth flip flop having a data input terminal connected to the output terminal of said selector, a clock input terminal connected to the output terminal of said first delay element, and a positive side output terminal from which the phase comparison result signal is output.

3. The DLL circuit as claimed in claim 1, wherein said edge detecting/phase comparing portion comprises:

a first delay element having an input terminal to which the first clock is input;

a second delay element having an input terminal connected to the output terminal of said first delay element;

a third delay element having an input terminal to which the second clock is input;

a first flip flop having a data input terminal connected to the output terminal of said third delay element and a clock input terminal to which the first clock is input;

a second flip flop having a data input terminal connected to the output terminal of said third delay element, a clock input terminal connected to the output terminal of said first delay element and a positive side output terminal from which an original comparison signal is output;

a third flip flop having a data input terminal connected to the output terminal of said third delay element and a clock input terminal connected to the output terminal of said second delay element;

a first AND circuit having two input terminals connected to the positive side output terminal of said third flip flop and the inversion side output terminal of said first flip flop, respectively;

a second AND circuit having two input terminals connected to the positive side output terminal of said first flip flop and the inversion side output terminal of said third flip flop, respectively;

a set/reset latch having a set input terminal connected to the output terminal of said first AND circuit, a reset input terminal connected to the output terminal of said second AND circuit and a positive side output terminal from which a selection signal is output;

a selector for receiving the original comparison signal and a phase comparison result signal, selecting the original comparison signal when the selection signal is logic "1" and the phase comparison result signal when the selection signal is logic "0", !and then outputting the selected signal; and a fourth flip flop having a data input terminal connected to the output terminal of said selector, a clock input terminal connected to the output terminal of said second delay element, and a positive side output terminal from which the phase comparison result signal is output.

4. A DLL circuit, comprising:

a frequency multiplier for receiving a first clock and multiplying the frequency of the first clock to generate and output a frequency-multiplied clock;

an edge detecting/phase comparing portion for receiving the first clock and the second clock, comparing the rise-up variations of the first and second clocks or the falling variations thereof every period of the first clock, internally generating an original comparison signal which is set to a first logical level when the variation of the second clock is prior to the variation of the first clock and is set to a second logical level when the variation of the second clock is subsequent to the variation of the first clock, and outputting the original comparison signal as a subsequent phase comparison result signal when it is detected that the level of the first clock and the level of the second clock have been varied in the same direction within a predetermined time, while keeping the output logical level of the phase comparison result signal and then outputting the phase comparison result signal as a subsequent phase comparison result signal when it is detected that the level of the first clock and the level of the second clock have been varied in the opposite directions within the predetermined time;

a variable delay portion for receiving the frequency-multiplied clock, delaying the frequency-multiplied clock on the basis of a control signal and outputting the delayed frequency-multiplied clock as an output clock; and a controller for outputting the control signal which instructs said variable delay portion to increase the delay amount when the phase comparison result signal is set to the first logical level, and also instructs said variable delay portion to reduce the delay amount when the phase comparison result signal is set to the second logical level.

5. The DLL circuit as claimed in claim 4, wherein said edge detecting/phase comparing portion comprises:

a first delay element having an input terminal to which the first clock is input;

a second delay element having an input terminal to which the second clock is input;

a third delay element having an input terminal connected to the output terminal of said second delay element;

a first flip flop having a data input terminal to which the second clock is input, and having a clock input terminal connected to the output terminal of the first delay element;

a second flip flop having a data input terminal connected to the output terminal of said second delay element, a clock input terminal connected to the output terminal of said first delay element and a positive side output terminal from which an original comparison signal is output;

a third flip flop having a data input terminal connected to the output terminal of said third delay element and a clock input terminal connected to the output terminal of said first delay element;

a first AND circuit having two input terminals connected to the positive side output terminal of said third flip flop and the inversion side output terminal of said first flip flop, respectively;

a second AND circuit having two input terminals connected to the positive side output terminal of said first flip flop and the inversion side output terminal of said third flip flop, respectively;

a set/reset latch having a set input terminal connected to the output terminal of said second AND circuit, a reset input terminal connected to the output terminal of said first AND circuit and a positive side output terminal from which a selection signal is output;

a selector for receiving the original comparison signal and a phase comparison result signal, selecting the original comparison signal when the selection signal is logic "1" and the phase comparison result signal when the selection signal is logic "0", and then outputting the selected signal; and a fourth flip flop having a data input terminal connected to the output terminal of said selector, a clock input terminal connected to the output terminal of said first delay element, and a positive side output terminal from which the phase comparison result signal is output.

6. The DLL circuit as claimed in claim 4, wherein said edge detecting/phase comparing portion comprises:

a first delay element having an input terminal to which the first clock is input;

a second delay element having an input terminal connected to the output terminal of said first delay element;

a third delay element having an input terminal to which the second clock is input;

a first flip flop having a data input terminal connected to the output terminal of said third delay element and a clock input terminal to which the first clock is input, a second flip flop having a data input terminal connected to the output terminal of said third delay element, a clock input terminal connected to the output terminal of said first delay element and a positive side output terminal from which an original comparison signal is output;

a third flip flop having a data input terminal connected to the output terminal of said third delay element and a clock input terminal connected to the output terminal of said second delay element;

a first AND circuit having two input terminals connected to the positive side output terminal of said third flip flop and the inversion side output terminal of said first flip flop, respectively;

a second AND circuit having two input terminals connected to the positive side output terminal of said first flip flop and the inversion side output terminal of said third flip flop, respectively;

a set/reset latch having a set input terminal connected to the output terminal of said first AND circuit, a reset input terminal connected to the output terminal of said second AND circuit and a positive side output terminal from which a selection signal is output;

a selector for receiving the original comparison signal and a phase comparison result signal, selecting the original comparison signal when the selection signal is logic "1" and the phase comparison result signal when the selection signal is logic "0", and then outputting the selected signal; and a fourth flip flop having a data input terminal connected to the output terminal of said selector, a clock input terminal connected to the output terminal of said second delay element, and a positive side output terminal from which the phase comparison result signal is output.

7. A DLL circuit, comprising:

an edge detecting/phase comparing portion for receiving a first clock and a second clock, comparing the rise-up variations of the first and second clocks or the falling variations thereof every period of the first clock, outputting a phase comparison result signal which is set to a first logical level when the variation of the second clock is prior to the variation of the first clock and to a second logical level when the variation of the second clock is subsequent to the variation of the first clock, and outputting a phase selecting signal whose logical level is inverted every time it is detected that the level of the first clock and the level of the second clock have been varied in the opposite directions within a predetermined time;

an input phase selecting circuit portion for receiving the first clock, generating an inverted signal, selecting the first clock and outputting it as a selected clock when the phase selecting signal is set to a predetermined logical level, while selecting an inverted signal of the first clock and then outputting the inverted signal as the selected clock when the phase selection signal has an inverted level of a predetermined logic level;

a variable delay portion for receiving the selected clock, delaying the selected clock on the basis of a control signal and outputting the delayed selected clock as an output clock; and a controller for outputting the control signal which instructs said variable delay portion to increase the delay amount when the phase comparison result signal is set to the first logical level, and also instructs said variable delay portion to reduce the delay amount when the phase comparison result signal is set to the second logical level.

8. The DLL circuit as claimed in claim 7, wherein said edge detecting/phase comparing portion comprises:

a first delay element. having an input terminal to which the first clock is input;

a second delay element having an input terminal to which the second clock is input;

a third delay element having an input terminal connected to the output terminal of said second delay element;

a first flip flop having a data input terminal to which the second clock is input, and having a clock input terminal connected to the output terminal of the first delay element;

a second flip flop having a data input terminal connected to the output terminal of said second: delay element, a clock input terminal connected to the output terminal of said first delay element and a positive side output terminal from which an original comparison signal is output;

a third flip flop having a data input terminal connected to the output terminal of said third delay element and a clock input terminal connected to the output terminal of said first delay element;

an AND circuit having two input terminals connected to the positive side output terminal of said third flip flop and the inversion side output terminal of said first flip flop, respectively;

a toggle type flip flop having an input terminal connected to the output terminal of said AND circuit, and a positive side output terminal from which the phase selecting signal is output; and a fourth flip flop having a data input terminal to which the original comparison signal is input, a clock input terminal connected to the output terminal of said first delay element, and a positive side output terminal from which the phase comparison result signal is output.

9. The DLL circuit as claimed in claim 7, wherein said edge detecting/phase comparing portion comprises:

a first delay element having an input terminal to which the first clock is input;

a second delay element having an input terminal connected to the output terminal of said first delay element;

a third delay element having an input terminal to which the second clock is input;

a first flip flop having a data input terminal connected to the output terminal of said third delay element and a clock input terminal to which the first clock is input, a second flip flop having a data input terminal connected to the output terminal of said third delay element, a clock input terminal connected to the output terminal of said first delay element and a positive side output terminal from which an original comparison signal is output;

a third flip flop having a data input terminal connected to the output terminal of said third delay element and a clock input terminal connected to the output terminal of said second delay element;

an AND circuit having two input terminals connected to the positive side output terminal of said first flip flop and the inversion side output terminal of said third flip flop, respectively;

a toggle type flip flop having an input terminal connected to the output terminal of said AND circuit and a positive side output terminal from which the phase selecting signal is output; and a fourth flip flop having a data input terminal to which the original comparison signal is input, a clock input terminal connected to the output terminal of said second delay element, and a positive side output terminal from which the phase comparison result signal is output.

* * * * *